(12) United States Patent
Powell

(10) Patent No.: US 10,570,516 B2
(45) Date of Patent: *Feb. 25, 2020

(54) SYSTEM AND METHOD FOR TRANSPORT

(71) Applicant: First Solar, Inc., Perrysburg, OH (US)

(72) Inventor: Rick C. Powell, Ann Arbor, MI (US)

(73) Assignee: First Solar, Inc., Tempe, AZ (US)

( * ) Notice: Subject to any disclaimer, the term of this patent is extended or adjusted under 35 U.S.C. 154(b) by 793 days.

This patent is subject to a terminal disclaimer.

(21) Appl. No.: 14/676,982

(22) Filed: Apr. 2, 2015

(65) Prior Publication Data

US 2015/0203963 A1   Jul. 23, 2015

Related U.S. Application Data

(62) Division of application No. 11/692,667, filed on Mar. 28, 2007, now Pat. No. 9,017,480.

(60) Provisional application No. 60/789,580, filed on Apr. 6, 2006.

(51) Int. Cl.
| | |
|---|---|
| *C23C 16/458* | (2006.01) |
| *C03B 35/18* | (2006.01) |
| *C23C 16/44* | (2006.01) |
| *C23C 16/455* | (2006.01) |
| *C23C 16/54* | (2006.01) |
| *H01L 21/677* | (2006.01) |

(52) U.S. Cl.
CPC .......... *C23C 16/4585* (2013.01); *C03B 35/18* (2013.01); *C03B 35/181* (2013.01); *C03B 35/183* (2013.01); *C23C 16/4401* (2013.01); *C23C 16/4586* (2013.01); *C23C 16/45591* (2013.01); *C23C 16/54* (2013.01); *C23C 16/545* (2013.01); *H01L 21/6776* (2013.01); *H01L 21/67706* (2013.01)

(58) Field of Classification Search
None
See application file for complete search history.

(56) References Cited

U.S. PATENT DOCUMENTS

| | | | |
|---|---|---|---|
| 2,872,254 A | | 2/1959 | McNaughton et al. |
| 3,735,728 A | | 5/1973 | Krumme et al. |
| 4,100,004 A | | 7/1978 | Moss et al. |
| 4,649,860 A | * | 3/1987 | Furukawa ............. C23C 14/562 |
| | | | 118/718 |
| 4,724,764 A | | 2/1988 | MacPhee et al. |

(Continued)

FOREIGN PATENT DOCUMENTS

| | | |
|---|---|---|
| GB | 721704 | 1/1955 |
| WO | WO-06/020409 | 2/2006 |

(Continued)

OTHER PUBLICATIONS

B. E. McCandless, et al., "Vapor transport deposition of cadmium telluride films," Conference Record of the 29th IEEE Photovoltaic Specialists Conference May 19-May 24, 2002; New York, NY; vol. Conf. 29, May 19, 2002; pp. 547-550.

(Continued)

*Primary Examiner* — Karla A Moore
(74) *Attorney, Agent, or Firm* — MacMillan, Sobanski & Todd, LLC

(57) ABSTRACT

A deposition system and method includes a deposition source, a roll conveyor and at least one shield positioned at a location proximate to the deposition source.

20 Claims, 15 Drawing Sheets

(56) References Cited

U.S. PATENT DOCUMENTS

| | | | |
|---|---|---|---|
| 4,742,750 | A | 5/1988 | Storey |
| 4,920,595 | A | 5/1990 | Fussinger et al. |
| 4,945,707 | A | 8/1990 | Cosmo |
| 5,248,349 | A * | 9/1993 | Foote .................. H01L 31/1836 118/719 |
| 5,462,602 | A | 10/1995 | Misiano et al. |
| 5,522,911 | A | 6/1996 | Terneu et al. |
| 5,689,768 | A | 11/1997 | Ehara et al. |
| 5,762,177 | A | 6/1998 | Baker et al. |
| 5,772,715 | A | 6/1998 | McMaster et al. |
| 5,945,163 | A | 8/1999 | Powell et al. |
| 6,037,241 | A | 3/2000 | Powell et al. |
| 6,132,517 | A | 10/2000 | Sivaramakrishnan et al. |
| 6,235,345 | B1 | 5/2001 | Williamson et al. |
| 6,719,848 | B2 | 4/2004 | Faykosh et al. |

FOREIGN PATENT DOCUMENTS

| | | |
|---|---|---|
| WO | WO-06/108564 | 10/2006 |
| WO | WO-2006105975 | 10/2006 |

OTHER PUBLICATIONS

D. Rose et al., "R&D of CdTe-absober photovoltaic cells, modules, and manufacturing equipment: plan and progress to 100 MW/yr," Conference Record of the Twenty-Eighth IEE Photovoltaic Specialists Conference—2000, pp. 428-431.

* cited by examiner

SYSTEM AND METHOD FOR TRANSPORT

CLAIM FOR PRIORITY

This application is a divisional of U.S. patent application Ser. No. 11/692,667, filed Mar. 28, 2007, now U.S. Pat. No. 9,017,480, which claims priority under 35 U.S.C. § 119(e) to Provisional U.S. Patent Application Ser. No. 60/789,580 filed on Apr. 6, 2006, each of which are hereby incorporated by reference.

TECHNICAL FIELD

The present invention relates to deposition of thin films.

BACKGROUND

In thin film deposition, a material is deposited on a substrate. As a result of this deposition, a roll conveyor can include at least one roller that transports the substrate can also be coated with a material. In order to maximize equipment uptime, it is desirable to minimize the deposited a material on the roll conveyor.

SUMMARY

In general, a vapor deposition system includes a roll conveyor including a first roller having larger diameter than a second roller.

In one aspect, a vapor deposition system includes a housing that defines an enclosed deposition chamber. The housing can include a lower portion and an upper portion having a horizontal junction with each other. A seal assembly can extend between the lower and upper housing portions at their horizontal junction.

A deposition system can include a roll conveyor located within the deposition chamber to convey substrates along a direction of conveyance. The roll conveyor includes at least one roller. The direction can be at a plane of conveyance below the horizontal junction of the lower and upper housing portions where the seal assembly is located. The roll conveyor can include at least one roller configured to operate at a temperature of less than 700° C. A deposition system can also include a deposition source located within the deposition chamber above the roll conveyor to provide deposition of a coating on the conveyed substrates at a deposition location. A deposition source can include a vapor deposition source. At least one shield can be positioned at a location distal or proximate to the deposition source. The housing can include an entry through which the substrates to be coated are introduced into the deposition chamber. A substrate can include a glass sheet substrate. The entry can be at a location below the horizontal junction of the lower and upper housing portions where the seal assembly is located. The housing can include an exit through which the coated substrates leave the deposition chamber. The exit can be at a location below the horizontal junction of the lower and upper housing portions where the seal assembly is located.

In another aspect, a roll conveyor can include a roller configured to have an optimized diameter that resists diameter increase as a result of accumulated deposition material. A roller diameter can be given by the formula:

$$d_f = \sqrt{\frac{4\dot{m}(1-f_P)t}{N_R f \pi \rho} + d_o^2}$$

In another aspect, a deposition system can include a roll conveyor, including at least one roller containing a heating element. A roller including a heating element, or a heated roller, can be wider than a substrate because no deposition will accumulate on the roller.

A deposition system can include at least one shield. The shield can be configured to remain static, or it can be movable. The shield can be a rotating shaft beneath the main roller bed. A shield can be an overspray collector. A shield can have the form of a disk, a cable, or a box, for example. The shield can have the form of a collector ribbon. The collector ribbon can be a roll-to-roll cassette. The collector ribbon can be a continuous loop. The shield can be transverse to a substrate transport direction. The shield can be parallel to a substrate transport direction. A scraper can be located at the outer edge of the shield at a position, such as, for example, a position distal to the substrate to prevent increases in shield diameter.

A deposition system can include at least one back-up or drive roller. A roller can be a bridge roller. A back-up or drive roller can be configured to support a bridge roller. A back-up roller can have a smaller diameter than a bridge roller. A back-up roller can be configured to maintain a substantially constant diameter and the bridge roller can be configured to operate at a substantially fixed speed.

In yet another aspect, a roller can be hollow. A heating element can be positioned inside a hollow roller. A deposition system can further include a hub on a roller. The hub can be configured to be driven by a shaft. A roller can be supported by at least one backup idler roller. The roller can be supported by at least one graphite bushing block.

A deposition system can include an overspray collector. The overspray collector can be configured to collect stray flux and minimize the collection of deposition material accumulation on a roller. The overspray collector can be a rotating horizontal disk. The disk can also be moved vertically to compensate for accumulating buildup. The overspray collector can be positioned proximate to a vapor distributor or adjacent to a vapor distributor. A scraper can be positioned at the outer edge of a shield, for example, at a position farthest from the substrate to prevent an increase in shield diameter.

A deposition system can include a moving cable. The moving cable can act as a stray flux collector. The cable can have a collecting surface that can be placed between multiple rollers. The cable can be part of a cable drive system located in at least one auxiliary chamber beneath the deposition system.

A deposition system can include at least one disk attached to a small diameter section of the roller. The disk can be positioned near the substrate edge. The disk can intercept overspray flux approaching the large diameter rim and can prevent or largely reduce the formation of rim build-up, thereby extending the duration between roller cleaning events.

In another aspect, a deposition system can include a cooling block. A deposition system can include an insulating sheath. An insulating sheath can include a ceramic. An insulating sheath can surround a heating element or a roller including a heating element. An insulating sheath can be positioned proximate to or adjacent to a roller containing a heating element. A deposition system can include a roller positioning stop collar.

In another aspect, a method for depositing a material on a substrate can include introducing a material and a carrier gas into a first chamber, heating the material such that a portion of the material vaporizes into a vapor, directing a mixture of the vapor and carrier gas through a second chamber to form a substantially uniform vapor/carrier gas composition, directing the substantially uniform vapor/carrier gas composition toward a surface of a substrate having a temperature lower than the vapor, such that the vapor condenses on the substrate as a film having substantially uniform thickness and crystallization, arranging at least one roller to convey a substrate along a direction of conveyance; and arranging at least one shield proximate to a vapor distributor to capture stray flux. The material can be a semiconductor material, for example. The method can also include capturing stray flux. The method can also include heating the roller. The roller can be heated to a temperature greater than 700° C., greater than 740° C., or greater than 780° C.

In another aspect, the method can also include positioning a back-up roller to support the roller. The method can also include positioning a heating element inside the roller.

DETAILED DESCRIPTION

Figure 1:
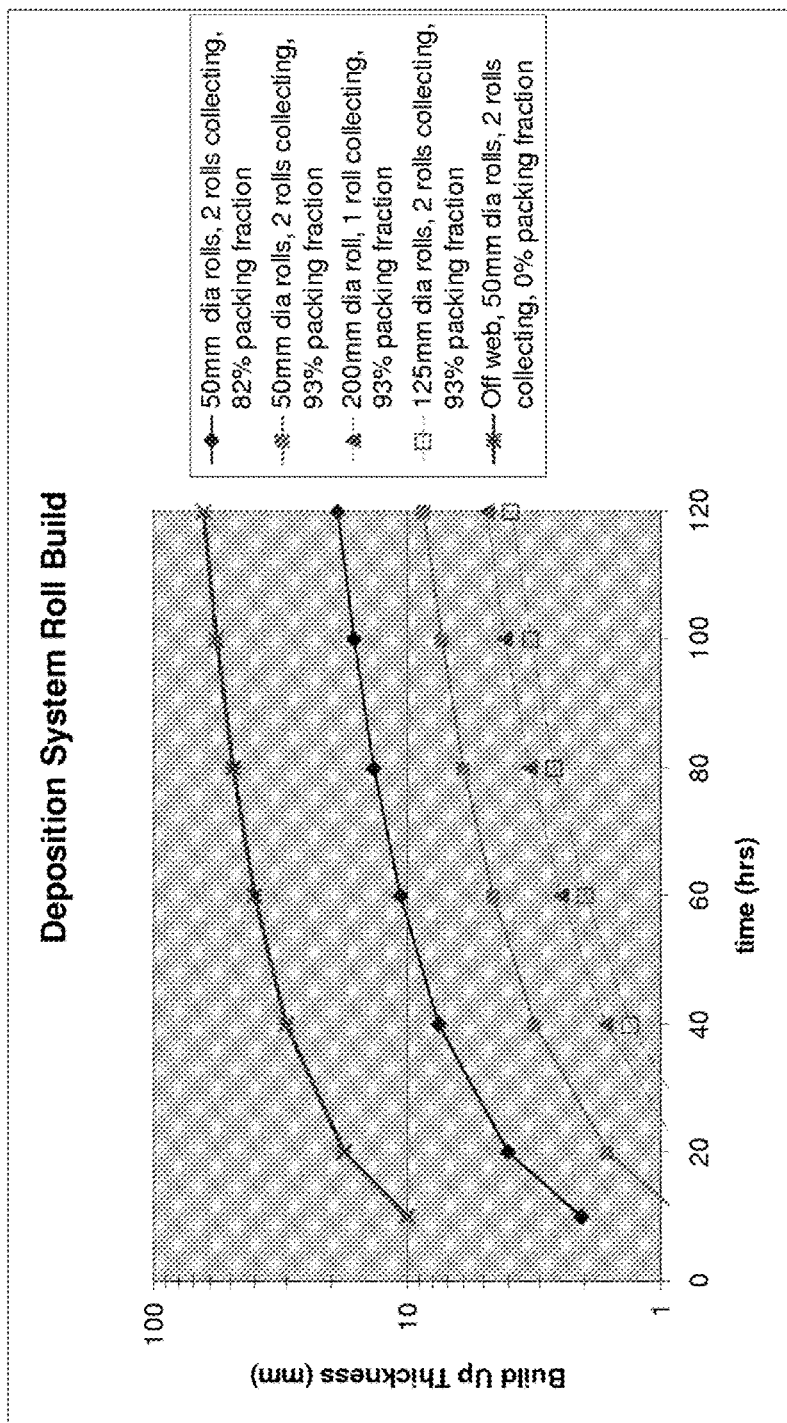
FIG. 1 is a graph depicting diameter and packing fraction affects.

Transporting a substrate, such as a glass substrate, using a roll conveyor including at least one roller is a reliable transport method. However, transporting a substrate in a vapor deposition environment can result in a roller collecting deposition material. As deposition material accumulates on a roller, the diameter of the roller increases over time. This roller diameter increase results in reduced function and efficiency of a deposition system. A deposition system can include a vapor deposition system.

A deposition system can include a roller whose diameter has been calculated to minimize deposition on the roller. In general, increasing the diameter of a roller in the deposition zone can substantially reduce the rate of roller diameter increase due to between-plate coating flux. A large diameter roller can be used in any portion of the deposition system, such as a deposition zone, for example. A large diameter roller can be used exclusively in the deposition zone, which can decrease the cost of the system.

A roller in which the largest diameter section that supports the substrate is narrower than the width of the substrate can provide more opportunity for a shield or an overspray collector, such as a disk or cable to capture or shield the overspray.

A large diameter roller can be supported and driven by a smaller shaft. Alternatively, a bridge roller can be supported by back-up or drive rollers. A bridge roller can also be driven by a shaft but supported by back-up rollers, or the large diameter roller can be driven by a shaft and supported by bushings operating at high temperature.

A deposition system can include a roller that is protected by a shield. A shield can be a static shield, an overspray collector or a cable. A roller can also contain a heating element to minimize deposition on the roller.

A deposition system can include an overspray collector. The overspray collector can be configured to collect stray flux and minimize the collection of deposition material accumulation on a roller. The overspray collector can be a rotating horizontal disk. The disk can also be moved vertically to compensate for accumulating buildup. The overspray collector can be positioned proximate to a vapor distributor or adjacent to a vapor distributor. A scraper can be positioned at the outer edge of a shield, for example, at a position farthest from the substrate to prevent an increase in shield diameter.

A deposition system can include a cable positioned at the perimeter of at least one roller. The cable can be a moving cable, for example. The cable can act as a stray flux collector. The cable can be positioned around the perimeter of multiple rollers. The cable can have a collecting surface that can be placed between multiple rollers. The cable can be part of a cable drive system located in at least one auxiliary chamber beneath the deposition system.

A deposition system can include at least one disk attached to a small diameter section of the roller. The disk can be positioned near the substrate edge. The disk can intercept overspray flux approaching the large diameter rim and can prevent or largely reduce the formation of rim build-up, thereby extending the duration between roller cleaning events.

A vapor deposition system can include a back-up roller. The back-up roller can be configured to support a roller such as a bridge roller. The back-up roller can be positioned in a lower region and the roller can be positioned on a surface region. So long as the diameter of a back-up roller remains largely unchanged, the surface speed of the bridge roller can remain fixed, thereby maintaining the efficiency of the system. A back-up roller can include a guidance means. An on-axis guide pin can also fix the axial position of the bridge roller if the bridge roller is solid, or has an end cap, for example.

A roller, such as a bridge roller can be hollow. A hollow design can reduce the weight and thermal mass of the bridge roller. It can also broaden a range of construction materials for the roller. A hollow bridge roller can have a temperature sensor inside the roller.

A roller can have an internal heating element, which can keep the roller above a condensation temperature, allowing the roller to stay clean or free from deposition. A temperature control means can be included to reach and maintain a desired temperature.

A vapor deposition system can include a roller whose diameter has been calculated to minimize deposition thickness on the roller. A large diameter roller that has a narrower width than the substrate minimizes the deposition thickness at the substrate edge that can reduce transport efficiency. For example, one can design a hub on a large diameter roll and drive it with a small diameter shaft, thereby making the large diameter roller a direct drive. The large diameter roller can be supported by lower back-up idler rollers or supported with graphite bushing blocks. A graphite roller can include a graphite shaft. The graphite shafts can be supported in a graphite block bushing from the floor.

A roller that is configured to operate at a temperature below 700° C. can be located where substrate tracks (mid web), and outside the substrate track (off-web). The purpose of a roller in the mid-web location is to support the substrate. Since the temperature of a roller is near the temperature of the substrate, condensation can occur on the roller, resulting in deposition material buildup and hindering the roller's transport function and efficiency.

Referring to FIG. 1, a roller's diameter and the packing fraction of the moving stream of discrete substrate plates affects the accumulation of deposited material on the roller, and accordingly, the thickness or diameter of the roller over time. In general, the lower the packing fraction and the fewer the number of rollers involved, the greater the buildup thickness. FIG. 1 shows that with large diameter rolls and the 93% packing fraction (9 cm between 120 cm long plates), the build-up mid web is almost negligible. For example, the build up on a pair of 125 mm diameter rolls after 120 hours is only 3.8 mm thick. Off web however, build up on the rolls (or axles to a large diameter roll) is excessive. For example if one condenses all of the flux onto 2 rollers or axles that start with a 50 mm diameter, the rollers are 180 mm diameter after 120 hours of operation.

To limit the increased thickness resulting from accumulated material that can result in altered transport, one can minimize the space between substrate pieces or maximize the packing fraction, use as large a diameter roller as possible, and deposit as thin a film as possible.

Figure 2:
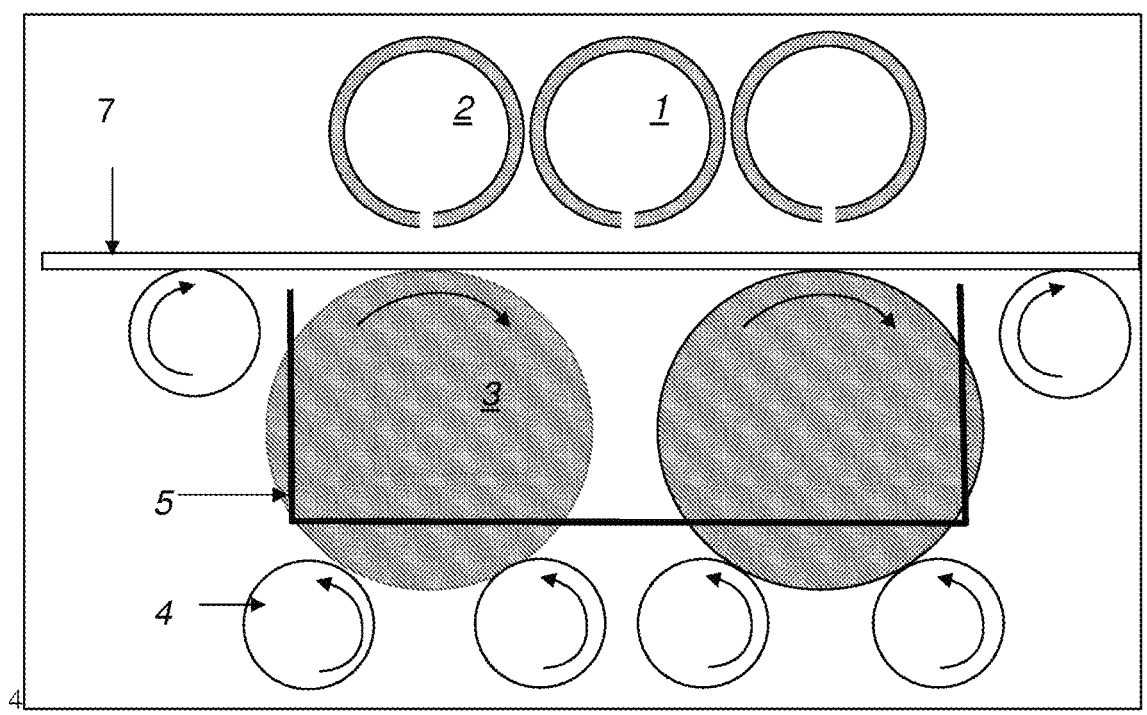
FIG. 2 is a drawing depicting a deposition transport system.

Referring to FIG. 2, a deposition system can include a distributor 1, an exhaust tube 2, a shield 5 positioned proximate to the distributor, and at least one large diameter roller 3 or a pair of large diameter rollers that can be narrower in width than the substrate 7. A large diameter roller can be supported from below by drive or back-up rollers 4. This configuration can completely eliminate rollers outside the substrate track. The large roller can be made from a graphite tube with end caps. The shield can be positioned adjacent to the distributor.

Figure 3:
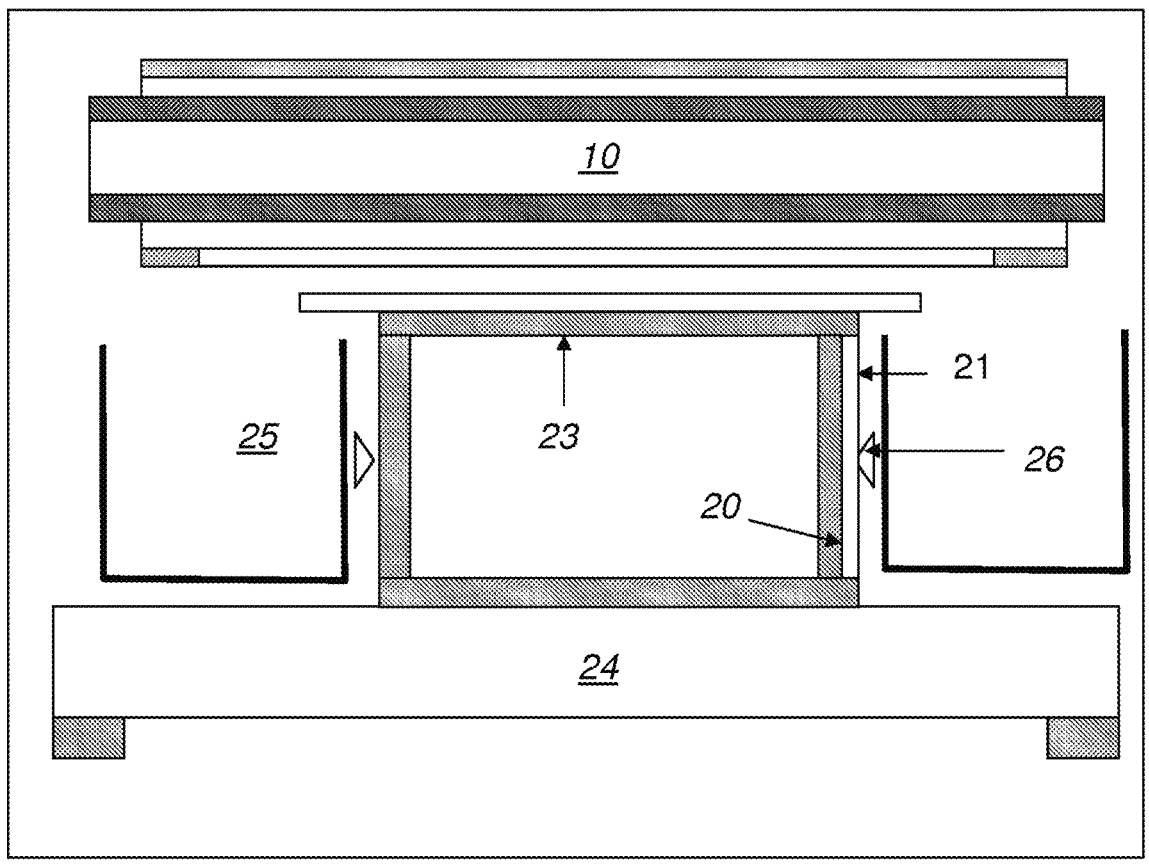
FIG. 3 is a drawing depicting a deposition transport system.

Referring to FIG. 3, a deposition system can include a distributor 10, a roller 20, at least one drive roller 24, and a shield 25, which can be an overspray collector. A roller can also include a threaded graphite end cap 21, which is configured to allow positioning stops 26. The roller can be hollow as shown in FIG. 3. A hollow roller can limit the weight and thus the load on the support rollers. A hollow roller can also limit the thermal mass, thereby reducing the start up thermal transient time. The drive roller can be ceramic.

Figure 4:
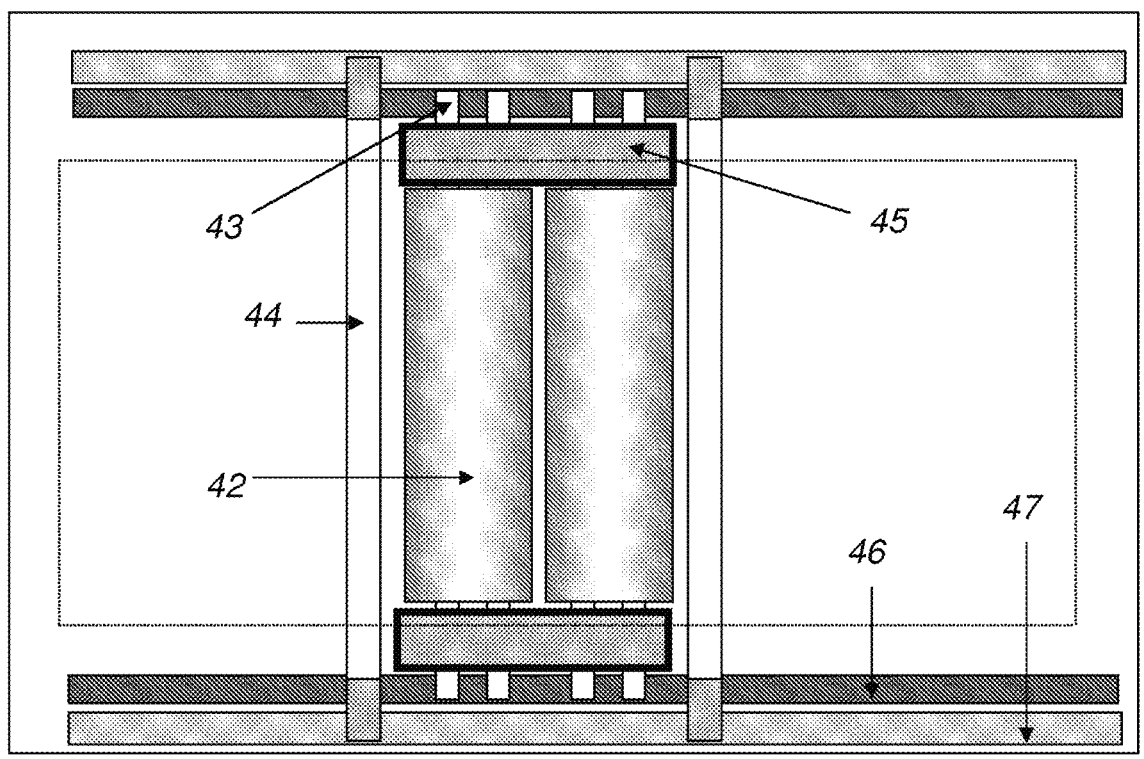
FIG. 4 is a drawing depicting a deposition transport system.

Referring to FIG. 4, a deposition system can include a plurality of large diameter rollers 42, at least one drive roller 43, a plurality of normal rollers 44, a shield 45, a chain 46 for the drive roller, and a chain 47 for the normal rollers. The shield can be a static shield. The shield can be a static shield. The shield can be a movable shield. The shield can be a rotating shaft beneath the main roller bed. The shield can be an overspray collection shield, which can span the width of a large diameter roller or a plurality of diameter rollers, and be positioned parallel to, transverse to, proximate to, or adjacent to at least one large diameter roller. Drive rollers can be positioned proximate to or adjacent to the overspray collection shield.

Figure 5:
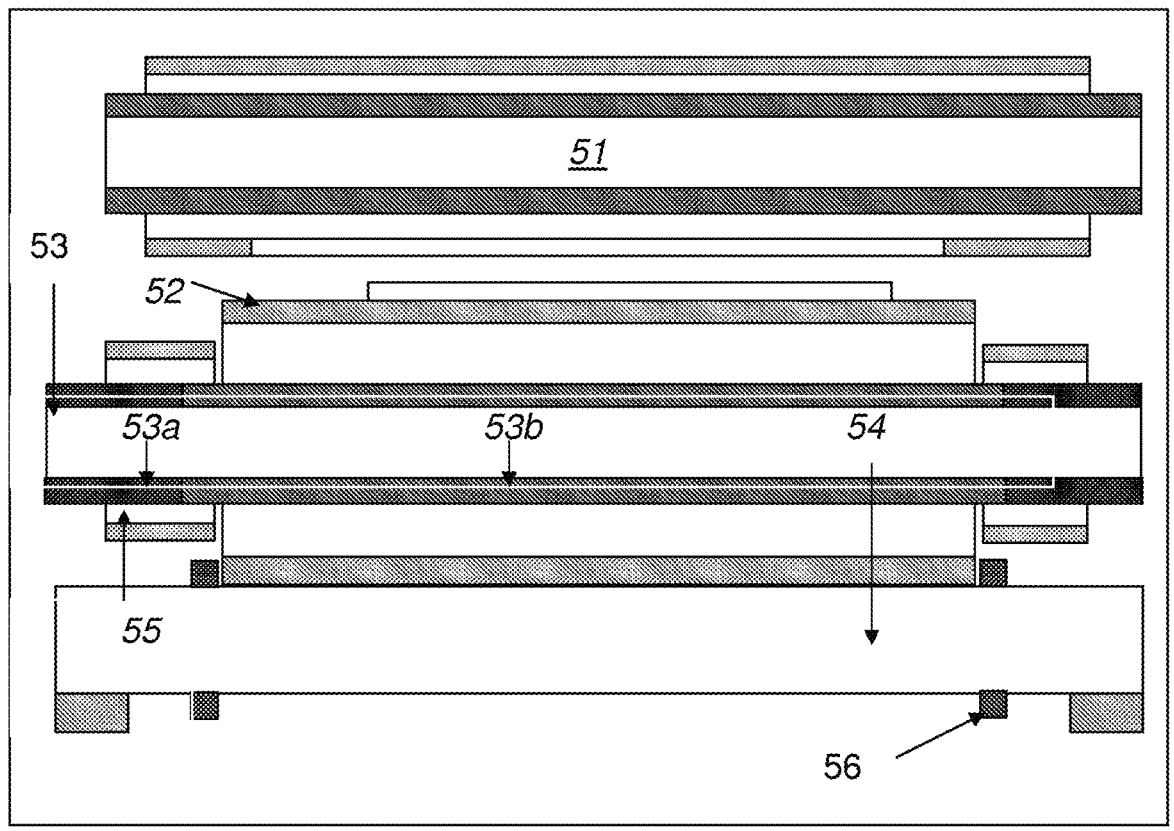
FIG. 5 is a drawing depicting a deposition transport system.

Referring to FIG. 5, a deposition system can include a distributor 51, at least one roller 52, an internal heating element 53 having cold zones 53a and a center hot zone 53b, a back-up or drive roller 54, and a ceramic insulating sheath 55. Roller positioning stop collars 56 can be positioned along a longitudinal axis of a drive roller and along either end of a roller 52. The internal heating element can be positioned inside a hollow roller. An insulating sheath can surround a heating element in at least one location adjacent to a roller or at both ends of a roller, flanking a substrate, for example.

Based on equilibrium partial pressures and carrier gas dilution, the temperature required to keep deposition flux from condensing on a roller or distributor sheath is approximately 740-810° C. In general, a surface temperature >700° C. can prevent deposition on a nearby roller.

If a temperature of greater than 700° C. is desired, significant power will be needed to maintain temperature differentials in a furnace. For example a hollow 50 mm diameter roller requires an internal heating power of 25 to 42 W/axial cm will be needed to maintain the roller at 700-750° C. in a 600° C. furnace. When one considers conduction transfer to the colder substrate mid-web, the power requirements can increase. Some of the highest power density heaters available include a tungsten filament, halogen filled sealed quartz envelop lamps can only provide ~30 W/axial cm.

Thus a single lamp probably cannot deliver enough power for a 50 mm diameter roller. As one increases the roller diameter, while the net energy required for radiation loss increases, the space available to position heaters increases and the frequency with which a particular location on the roller loses heat to the substrate conduction reduces.

A hollow roller conveyor system with drive rollers underneath can be well suited to an internally heated roller configuration because the roller diameters are large and the axis can be free from obstructions. In addition the hollow roller intercepts all of the radiant power emanating from the heater. The hollow roller in this case need only be large enough to accommodate the required heater power. To maintain the surface at 700-750° C. for an 86 mm diameter roller can require approximately 50-80 W/cm which can easily be provided by 50 mm diameter SiC heaters for example.

Figure 6:
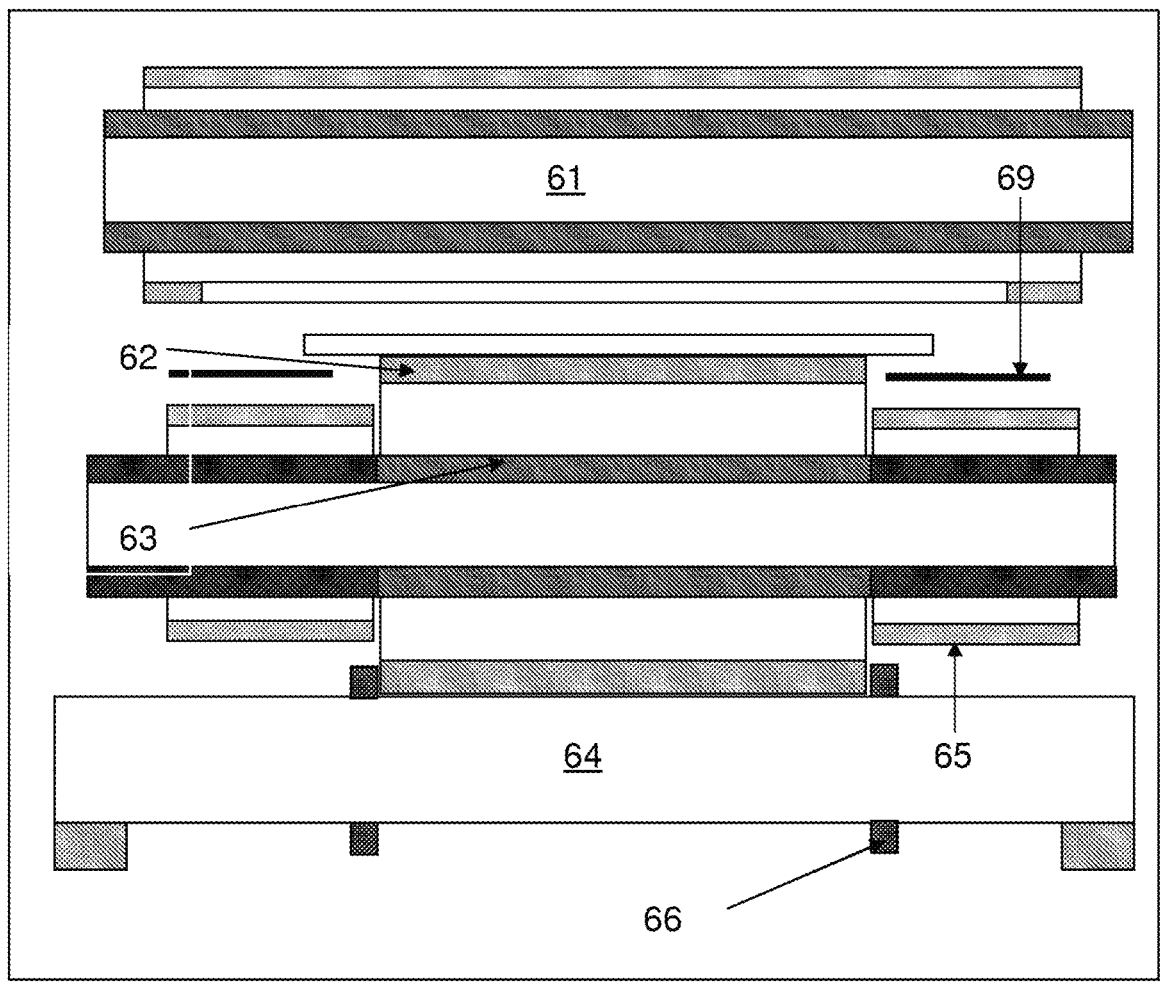
FIG. 6 is a drawing depicting a deposition transport system.

Referring to FIG. 6, a deposition system can include a distributor 61, a roller 62, an internal heater 63, a back-up or drive roller 64, a ceramic insulating sheath 65, roller positioning stop collars 66, and a movable overspray collection shield 69 proximate to the distributor. In the case of heated rollers, the problem of waste management of stray vapor still remains. Vapors that do not condense on the rollers must go somewhere and their movement must be controlled. In general, the waste vapors can be captured closest to the distributor. Capturing the vapor as soon as possible is the preferred method, and capturing the vapors on cold surfaces is highly effective, so long as there is sufficient collection capacity. In the case of heated rollers, the roller can be wider than the substrate since no deposition will occur.

Figure 7:
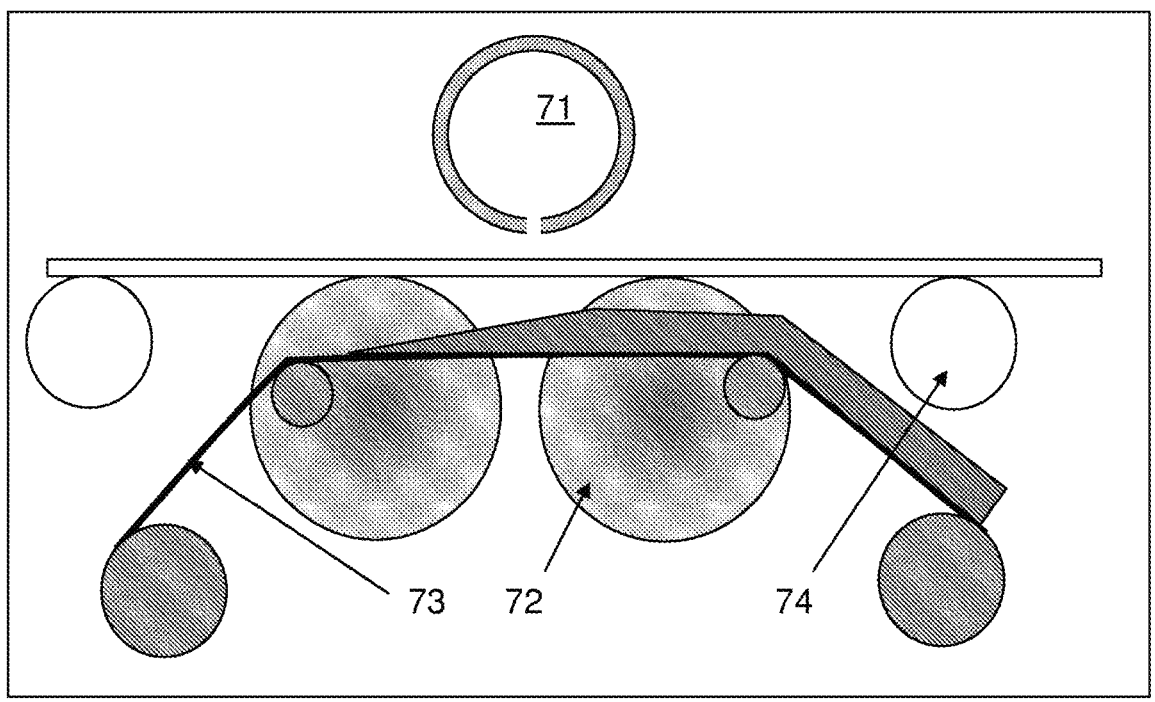
FIG. 7 is a drawing depicting a deposition transport system.

Referring to FIG. 7, a deposition system can include a distributor 71, a small diameter roller 74, a plurality of large diameter rollers 72, movable overspray catch shield 73. The shield can be in the form of a collector ribbon, a roll-to-roll cassette, or a continuous loop. The shield can be positioned transverse to or parallel to the transport direction.

Figure 8:
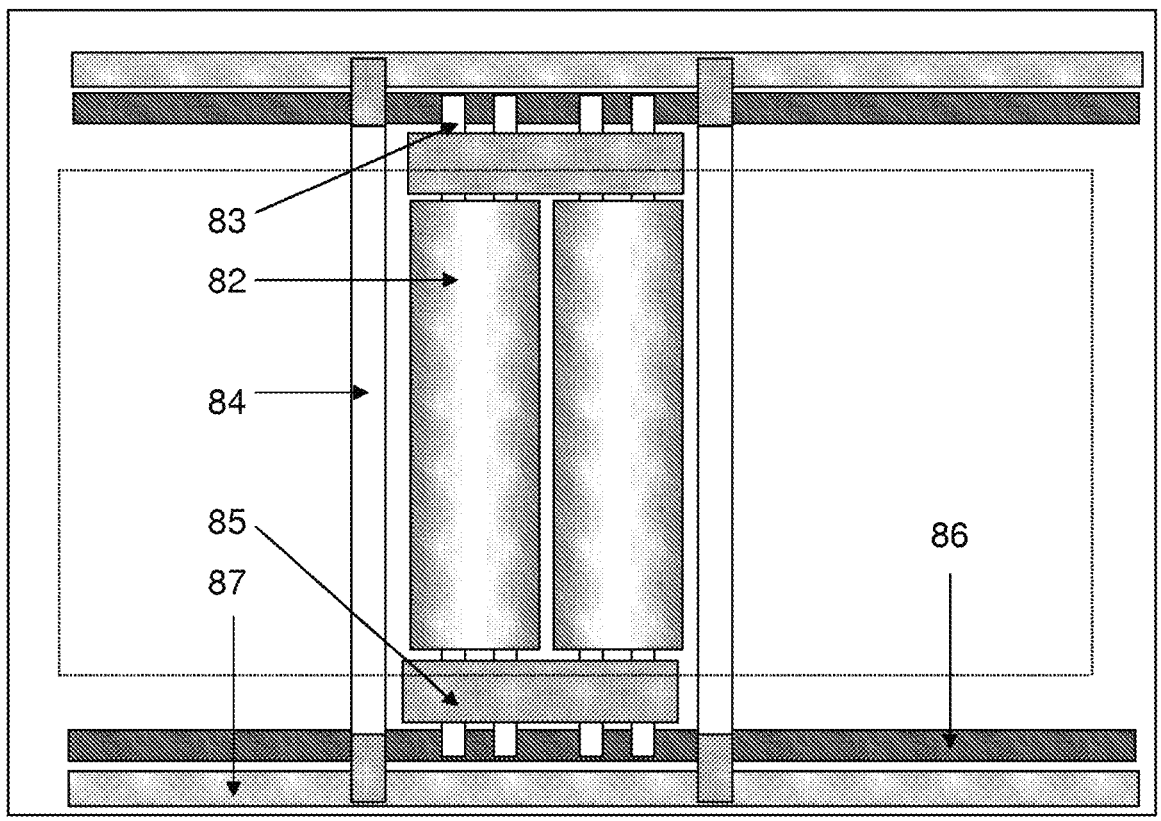
FIG. 8 is a drawing depicting a deposition transport system.

Referring to FIG. 8, a deposition system can include at least one large-diameter roller 82, at least one drive roller 83, at least one normal roller 84, a moveable shield 85, a drive roller chain 86, and a normal roller chain 87.

Figure 9:
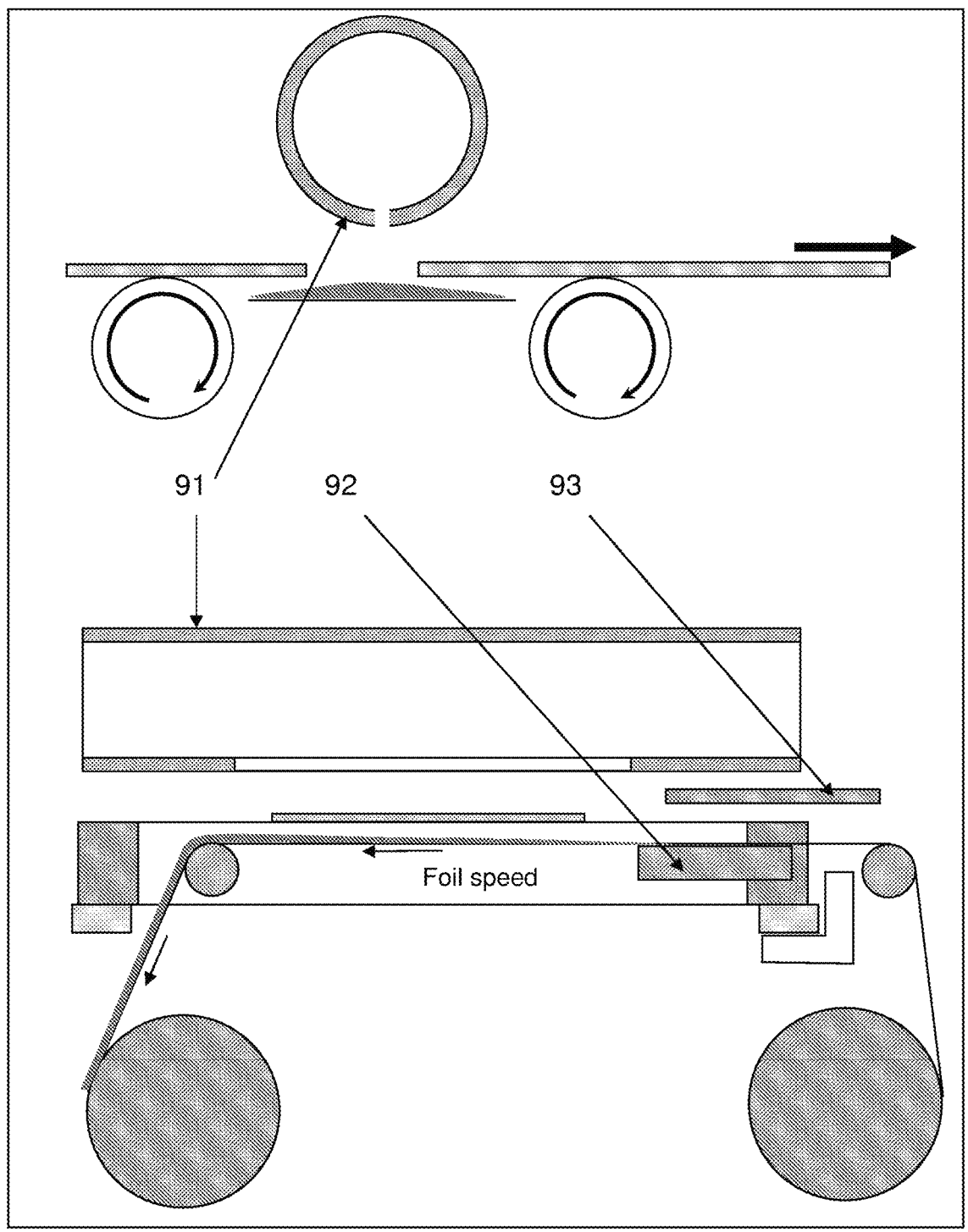
FIG. 9 is a drawing depicting a deposition transport system.

Referring to FIG. 9, a deposition system can include a deposition source, such as a distributor 91, a cooling block 92, and a radiation shield 93. A shield can be movable or static. The shield can be a rotating shaft beneath the main roller bed. The shield can be a cross-web foil shield. The shield can be positioned proximate to or adjacent to a distributor.

Figure 10:
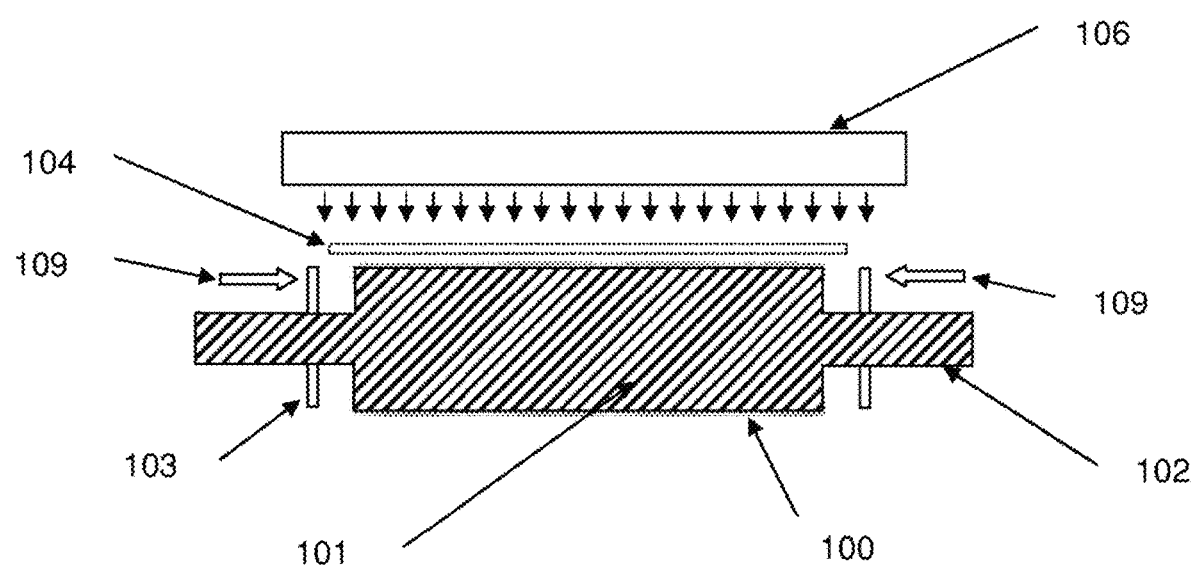
FIG. 10 is a drawing depicting a deposition transport system.

Referring to FIG. 10, a deposition system can include a deposition source, a roller, such as a large diameter roller 101 near a deposition source, a roller shaft 102 having a smaller diameter (i.e. a small diameter roller shaft) than a roller near a deposition source, and a shield 103, which can be a disk shield mounted on a roller shaft. Deposition buildup 100 can accumulate in the system as deposition flux and axial deposition flux 109 is released from the deposition source 106 to the substrate 104. Deposition buildup can increase the effective diameter of a roller, so that without a change in drive speed, plate position advances during the course of operation. Shielding the rollers can allow the capture of overspray and prevent accumulation of deposits onto the rollers.

Figure 11:
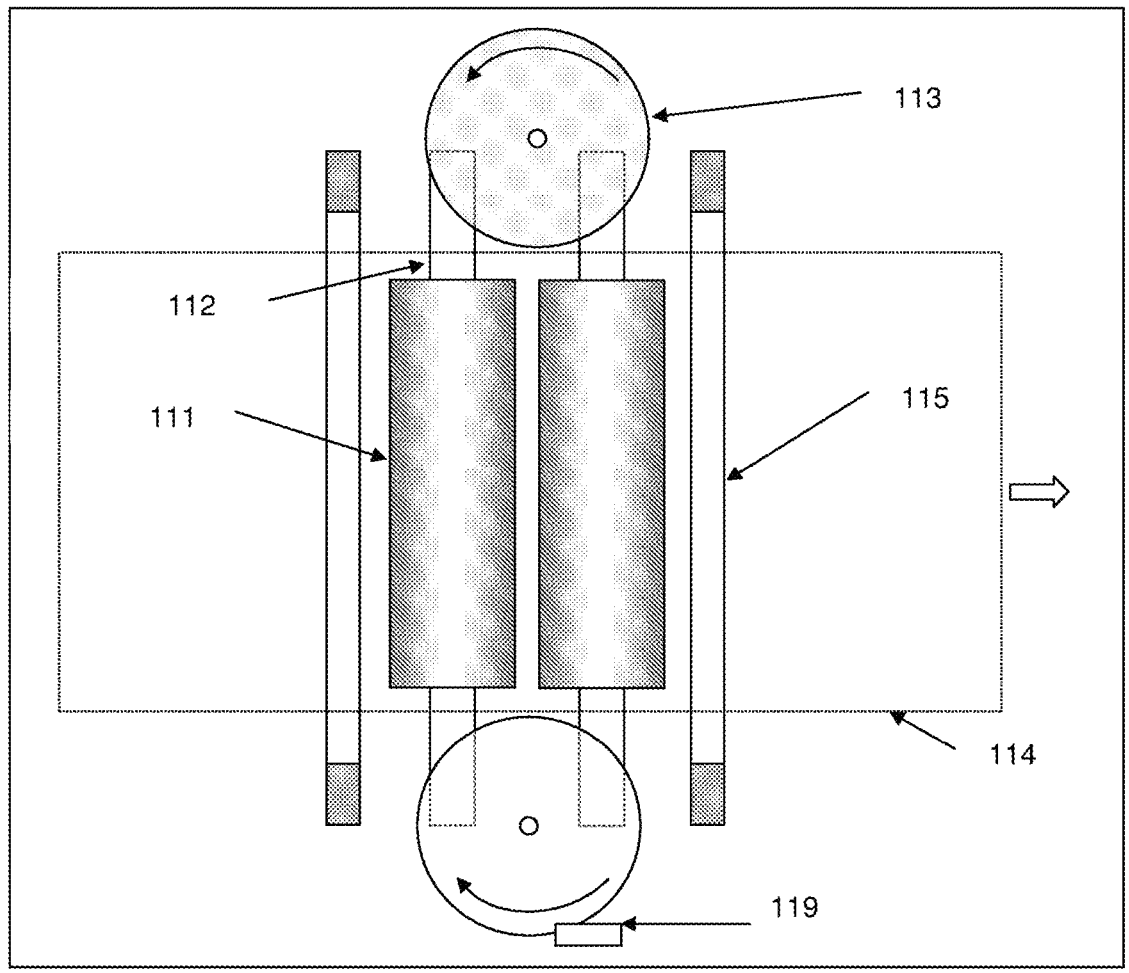
FIG. 11 is a drawing depicting a deposition transport system.

Referring to FIG. 11, a deposition system can include a substrate 114, a roller shaft 112 having a smaller diameter than a roller 111 proximate to a deposition source. A deposition system can also include a transport roller 115 distal to a deposition location and a horizontal overspray collector 113, which can be a disk, such as a horizontal disk that can rotate located near the substrate edge and can capture overspray. The overspray collector can be moved vertically to compensate for accumulating buildup. The overspray collector can be configured to collect stray flux and minimize the collection of deposition material accumulation on a roller. A disk can be located at an outer edge of a shield at a position farthest from the substrate to prevent an increase in shield diameter. The overspray collector can be positioned proximate to a vapor distributor or adjacent to a vapor distributor. A scraper 119 can be positioned at the outer edge of a shield, such as a disk, at a position farthest from the substrate to prevent increases in shield diameter.

Figure 12:
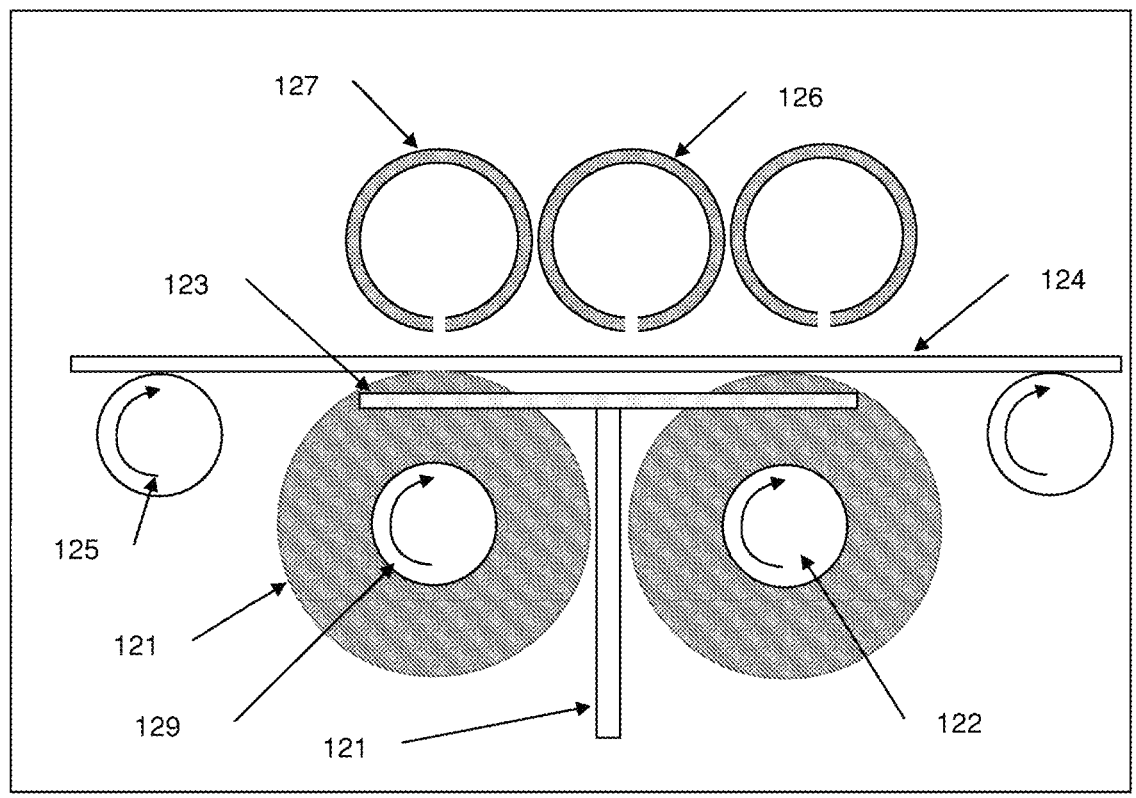
FIG. 12 is a drawing depicting a deposition transport system.

Referring to FIG. 12, a deposition system can include a small diameter roller shaft 122, a horizontal rotating disk 123, a substrate 124, a smaller diameter roller 125 distal from a deposition location, a deposition source 126, an inert gas exhaust 127, a larger diameter roller 121 proximate to a deposition source, and a horizontal disk drive shaft 121 for driving and supporting the rotating shield. A hub 129 can be positioned in the roller to drive the roller.

Figure 13:
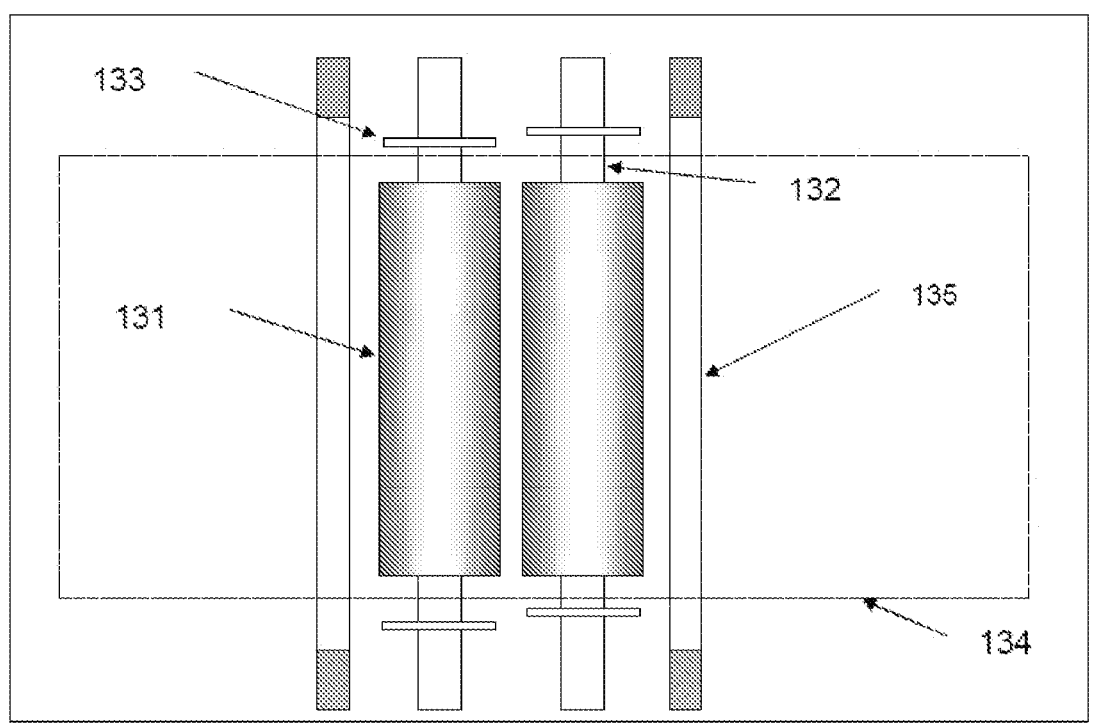
FIG. 13 is a drawing depicting a deposition transport system.

Referring to FIG. 13, a deposition system can prevent the nonuniform buildup of roller deposits, particularly at the rim of a large diameter section. Such a deposition system can include, for example, a large diameter roller 131, a substrate 134, a small diameter roller 135 distal to a deposition location, and at least one disk 133 mounted on a roller shaft or attached to a small diameter section of the small diameter roller 132 proximate to a deposition location. One or more disks can be attached to a small diameter section of a roller located near a substrate edge. The disk can intercept overspray flux approaching the large diameter rim and can prevent or largely reduce the formation of rim build-up, thereby extending the duration between roller cleaning events.

Figure 14:
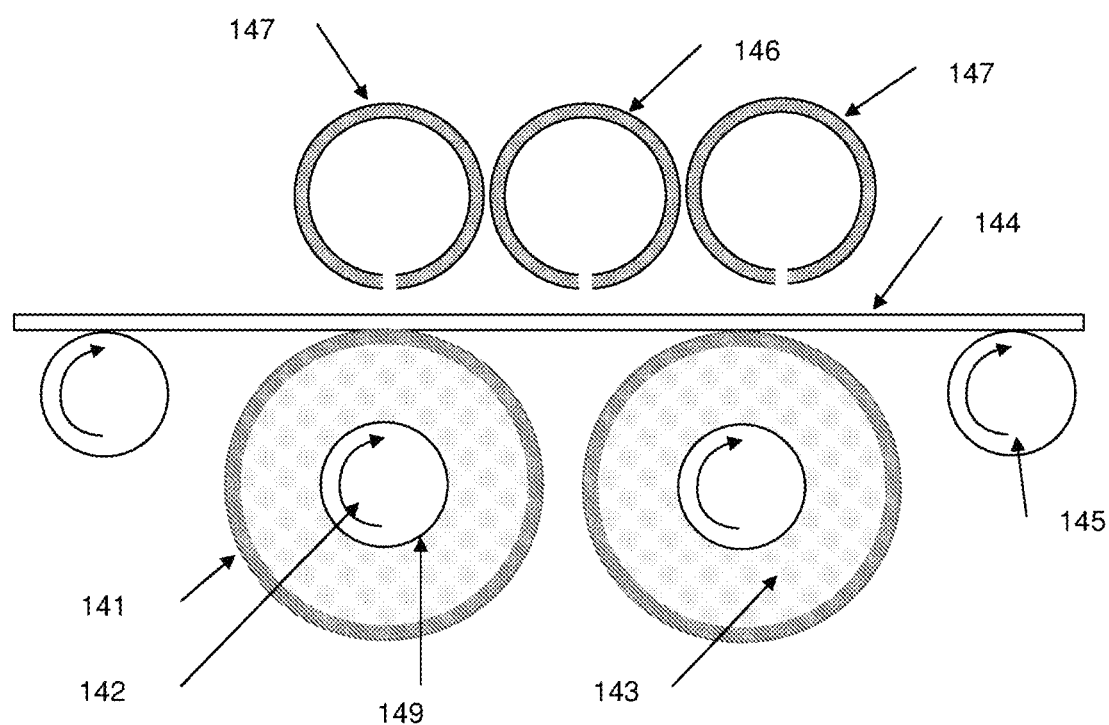
FIG. 14 is a drawing depicting a deposition transport system.

Referring to FIG. 14, a deposition system can include a large diameter roller 141, a substrate 144, a small diameter roller 145 distal to a deposition location, a deposition source 146, an inert gas exhaust 147, a small diameter roller shaft 142, and a disk 143 mounted on the roller shaft configured to prevent nonuniform buildup of roller deposits, particularly at the rim of the large diameter section of the large diameter roller. A hub 149 can be positioned inside the roller to drive the roller.

Figure 15:
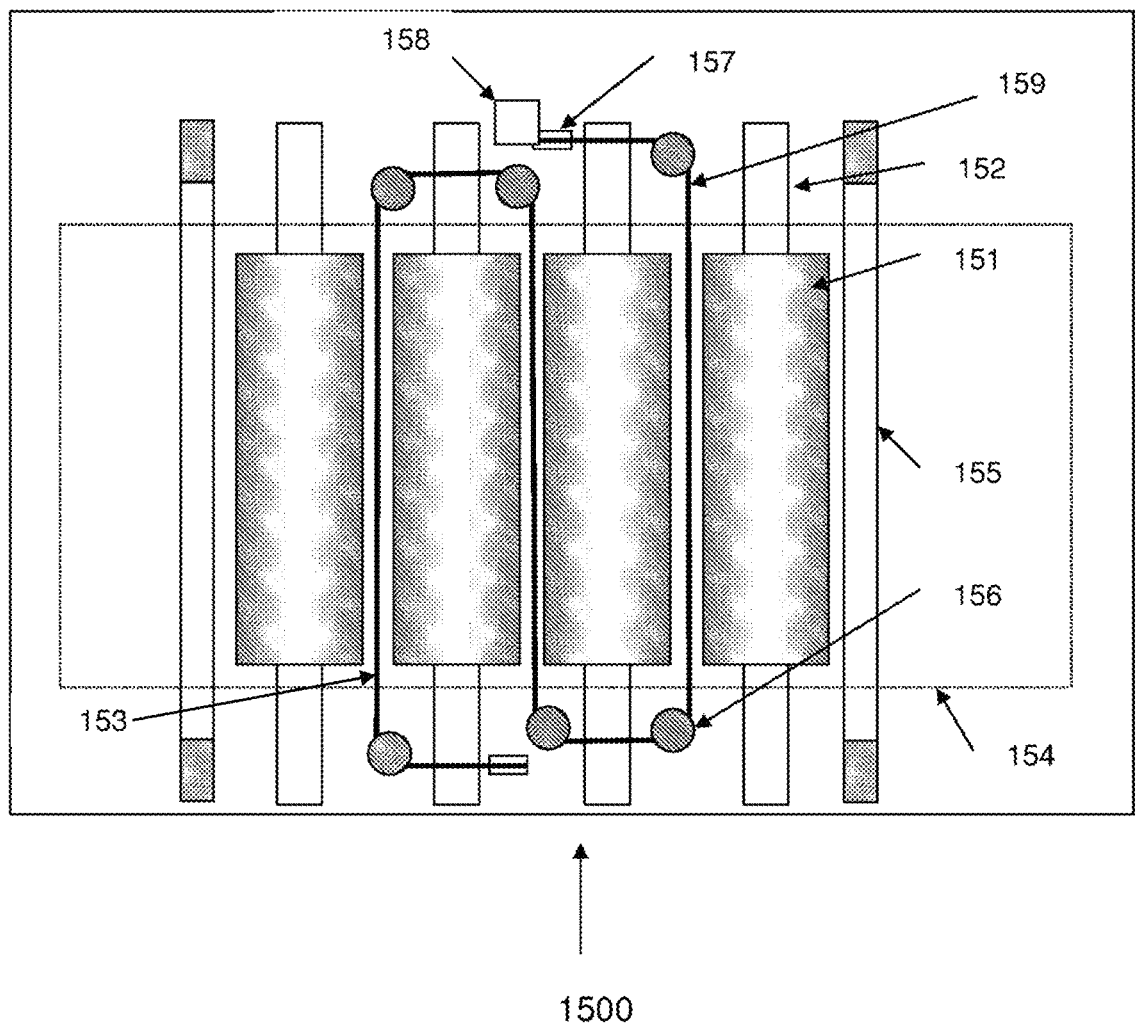
FIG. 15 is a drawing depicting a deposition transport system.

Referring to FIG. 15, a deposition system 1500 can prevent the buildup of deposits, not only at the rollers nearest to the deposition source, but also on its neighboring rollers. A deposition system can include, for example, a larger diameter roller 151 proximate to a deposition source, a small diameter roller shaft 152, a substrate 154, a smaller diameter transport roller 155 distal from a deposition location, at least one horizontal pulley 156, at least one vertical pulley 157, a drive system 158, and a cable 153. The cable can be a moving cable and can act as a stray flux collector. The cable can have a collecting surface 159 that can be placed between multiple rollers. The cable can enable multi-direction motion so that the collecting surface collects overspray from multiple rollers. The cable can be part of a cable drive system located in at least one auxiliary chamber beneath the deposition system.

In a standard roller hearth, the purpose of a roller outside the substrate track is to support the roller inside the substrate track and to transfer torque from the relatively cold friction drive chain into the portion of the roller inside substrate track where it is hot. Single diameter rollers can present a problem in an off-web location because these rollers are never shielded from deposition flux by the substrate.

To quantify the situation a simple calculation is instructive. Assume that all the deposition flux leaving the distributor that does not condense on the substrate deposits on the nearest neighbor rollers (either on 1 or 2 rollers depending on geometry) and that no deposition occurs along the axis. One can then easily calculate the final roller diameter $d_f$ as follows.

$$\rho 2\pi r dr = \frac{\dot{m}}{N_R \ell}(1 - f_P)dt$$

$$d_f = \sqrt{\frac{4\dot{m}(1 - f_P)t}{N_R \ell \pi \rho} + d_o^2}$$

where $t$ = run time $f_P$ = Web Packing Fraction $\dot{m}$ = mass feed rate[gm/min]

$\ell$ = slot length[cm]

$d$ = roll diameter[cm]

$\rho$ = density[gm/cm$^3$]

$N_R$ = Number of rolls that collect vapor

A deposition system constructed in accordance with the present invention generally includes a housing that defines an enclosed deposition chamber in which vapor deposition takes place as is hereinafter more fully described. The housing includes a lower portion and an upper portion that have a horizontal planar junction with each other. A seal assembly extends between the lower and upper housing portions and at their horizontal junction to seal the housing. This seal assembly extends along each lateral side of the elongated length of the system housing and along each of its opposite ends so as to extend completely around the housing.

A roll conveyor can be located within the deposition chamber to convey substrate sheet substrate along a direction of conveyance at a plane of conveyance. This plane of conveyance can be located below the horizontal junction of the lower and upper housing portions and where the seal assembly is located.

A distributor can include distributor plenums that are located within the deposition chamber above the roll conveyor to provide chemical vapor deposition of a coating on the conveyed substrates. The distributor plenums can be of the type disclosed by U.S. Pat. No. 5,945,163 to Powell et al. and U.S. Pat. No. 6,037,241 to Powell et al., the entire disclosures of which are hereby incorporated by reference, wherein the vapor to be deposited is passed through a heated permeable membrane prior to being discharged for flow downwardly toward the roll conveyor onto the adjacent conveyed substrate for the deposition. Chemical vapor deposition is described in U.S. Pat. No. 6,719,848, which is incorporated by reference in its entirety.

The housing can include an entry through which the substrate to be coated are introduced into the deposition chamber about a location below the horizontal junction of the lower and upper housing portions where the seal assembly is located. In addition, the housing can include an exit through which the coated substrates leave the deposition chamber at a location below the horizontal junction of the lower and upper housing portions where the seal assembly is located. The entry and exit as can function as open passageways between other processing systems.

The entry can receive heated substrate sheets from a heating furnace for the deposition, and the exit can transfer the coated substrate sheets for further processing. In that case, the other system portions will have suitable seals that maintain the contained environment therein as well as within the deposition system. Such seals can be conventional load lock cells with spaced gates and evacuation pumping apparatus for providing the substrate sheet introduction in a conventional manner without any introduction of the environmental atmosphere into the deposition chamber.

In addition, it is also possible for the entry and exit to be load lock cells or any type of suitable engagement seals or a slit seal for permitting continuous introduction of substrate sheets such as disclosed by U.S. Pat. No. 5,772,715, the entire disclosure of which is hereby incorporated by reference.

A deposition source can include a distributor. A distributor can have a material source that feeds a pair of inlets to opposite lateral sides of the system for flow to the opposite lateral ends of distributor plenums in order to ensure uniform distribution of the deposition on the substrates as they are conveyed along the roll conveyor.

A deposition system can include a vacuum source for drawing a vacuum in the deposition chamber through a conduit under the control of a valve. The seal assembly is between the lower and upper housing portions and includes inner and outer seal members that extend around the entire periphery of the housing at its elongated lateral sides as well as its opposite ends.

Inner and outer seal members can be spaced from each other to define an intermediate seal space. This seal space is thus located between the deposition chamber and the ambient. A vacuum is drawn in the intermediate seal space through a conduit under the control of a valve so as to be of a lesser vacuum than the vacuum in the deposition chamber. A sensor can function to sense the level of the vacuum in the intermediate seal space to sense leakage of the inner seal member or the outer seal member. More specifically, when the sensor senses an increase in the vacuum in the intermediate seal space, there is an indication that the inner seal member is permitting leakage. Conversely, when the sensor senses a decrease in the vacuum in the intermediate seal space, there is an indication that the outer seal member is leaking. Thus, the system can monitor both the inner and outer seal members of the seal assembly to ensure its effective sealing function.

A seal assembly can include lower and upper seal flanges on the lower and upper housing portions. The inner and outer seal members extend between the lower and upper seal flanges to seal between the lower and upper housing portions. Upon downward movement of the upper housing portion onto the lower housing portion, guides provide proper positioning of the upper housing portion. Clamps can be spaced around the periphery of the housing to secure the seal flanges to each other.

A deposition system can include an oven that is located within the housing and has an elongated length corresponding to the length of the housing, and the oven can have opposite lateral slots through which the roll conveyor and the vapor distributor project from the heated oven. The oven has an insulated construction and is mounted on the housing by supports Within its interior, the oven includes heaters that can be electrically connected in banks to control temperature differentials of the substrates laterally with respect to the direction of conveyance as well as controlling heating of their upper and lower surfaces to compensate for any radiation and conduction of the lower substrate surfaces provided by the roll conveyor. Each electrical heater can have an electric resistance element across which a voltage is applied, and each heater includes protective envelope through which the associated electric resistance elements extend so as to be protected.

The roll conveyor can include at least one roller spaced along the direction of conveyance along the elongated direction of the direction of conveyance. A roller can have ends that project outwardly from the oven through its side slots, respectively, adjacent the lateral sides of the housing. The system housing has drive portions that are in sealed communication with the deposition chamber externally of the oven. A drive mechanism can be located within the drive portions of the system housing and can have vertically extending drive chains that are driven by a gear box and a cross shaft to drive upper drive gear units that engage and rotatively drive the roller ends eternally of the oven but within the housing. As such, the drive mechanism is not subjected to the heating involved with the interior of the oven and can be manufactured more economically to function at a lower temperature.

A deposition transport system can have a screen that is located below the roll conveyor to catch any broken substrates. More specifically, the screen can be made of stainless steel and include suitable stiffeners, with the stainless steel screen having openings of about 1 to 2 centimeters so as not to disrupt the radiant heat flow from the lower heaters.

Although the method and system are described with reference to transporting substrates in a thin film deposition system, it should be apparent that the method and system may be utilized for processing other substantially planar substrates. As such, the scope of the claims should not be defined narrowly based on the foregoing description.

What is claimed is:

1. A method for depositing a material on a substrate, comprising:
    transporting the substrate into a deposition chamber enclosed by a housing;
    conveying the substrate, in a transport direction, at a plane of conveyance, on a roll conveyor located within the deposition chamber; the roll conveyor comprising:
        a plurality of rollers having an elongated length perpendicular to the transport direction, and
        a plurality of roller shafts having an elongated length perpendicular to the transport direction, wherein the plurality of roller shafts support and drive the plurality of rollers, wherein the plurality of roller shafts are longer than the plurality of rollers, and wherein the plurality of roller shafts have end portions at both ends of their elongated length extending beyond the elongated lengths of each of the plurality of rollers;
    providing a vapor from a deposition source in the deposition chamber, wherein the deposition source is above the plane of conveyance;
    directing the vapor toward a surface of the substrate having a temperature lower than the vapor, such that at least a portion of the vapor condenses on the substrate as a film; and
    collecting an overspray of the vapor on a shield, wherein at least a portion of the shield is located below the plane of conveyance.

2. The method of claim 1, wherein the shield is a collector ribbon.

3. The method of claim 2, wherein the collector ribbon is a continuous loop.

4. The method of claim 1, wherein the shield moves transverse to the transport direction.

5. The method of claim 1, wherein the shield moves parallel to the transport direction.

6. The method of claim 1, further comprising heating a roller of the plurality of rollers.

7. The method of claim 6, wherein heating includes heating the roller to a temperature greater than 700° C.

8. The method of claim 6, wherein heating comprises maintaining a temperature in a range of about 700-750° C. at a surface of the roller.

9. The method of claim 6, wherein heating includes heating the roller to a temperature greater than 780° C.

10. The method of claim 1, further comprising supporting the plurality of rollers using at least one back-up roller.

11. The method of claim 1, wherein the shield is located entirely below the plane of conveyance.

12. The method of claim 1, wherein collecting an overspray of the vapor on a shield, further comprises:
    moving the shield in a continuous loop through the deposition chamber, wherein the shield is a collector ribbon or a shielding cable with a collecting surface, and wherein the continuous loop moves between adjacent ones of the plurality of rollers, between adjacent ones of the plurality of roller shafts, or above the end portions of the plurality of roller shafts, thereby reducing overspray buildup on the roll conveyor.

13. A method for depositing a material on a substrate, comprising:
    transporting the substrate into a deposition chamber enclosed by a housing;
    conveying the substrate, in a transport direction, at a plane of conveyance, on a roll conveyor located within the deposition chamber; the roll conveyor comprising:
        a plurality of rollers having an elongated length perpendicular to the transport direction, wherein the plurality of rollers support and convey the substrate, the plurality of rollers each having end portions at both ends of their elongated length, wherein at least one roller, of the plurality of rollers, has an off-web portion extending beyond a substrate track width;
    providing a vapor from a deposition source in the deposition chamber, wherein the deposition source is above the plane of conveyance;
    directing the vapor toward a surface of the substrate having a temperature lower than the vapor, such that at least a portion of the vapor condenses on the substrate as a film;
    positioning at least a portion of a shield between the deposition source and the off-web portion of the at least one roller; and
    collecting an overspray of the vapor on the shield, wherein at least a portion of the shield is located below the plane of conveyance, and wherein the shield is a collector ribbon.

14. The method of claim 13, wherein the at least one roller having an off-web portion is a drive roller.

15. The method of claim 13, further comprising heating a roller of the plurality of rollers.

16. The method of claim 15, wherein heating comprises maintaining a temperature in a range of about 700-750° C. at a surface of the roller.

17. The method of claim 13, wherein at least a portion of the collector ribbon moves transverse to the transport direction.

18. The method of claim 13, wherein at least a portion of the collector ribbon moves parallel to the transport direction.

19. A method for depositing a material on a substrate, comprising:
    transporting the substrate into a deposition chamber enclosed by a housing;
    conveying the substrate, in a transport direction, at a plane of conveyance, on a roll conveyor located within the deposition chamber; the roll conveyor comprising:
        a plurality of rollers having an elongated length perpendicular to the transport direction, wherein the plurality of rollers support and convey the substrate, the plurality of rollers each having end portions at both ends of their elongated length, wherein at least one roller, of the plurality of rollers, has an off-web portion extending beyond a substrate track width;
    providing a vapor from a deposition source in the deposition chamber, wherein the deposition source is above the plane of conveyance;
    directing the vapor toward a surface of the substrate having a temperature lower than the vapor, such that at least a portion of the vapor condenses on the substrate as a film;
    positioning at least a portion of a shield between the deposition source and the off-web portion of the at least one roller; and
    collecting an overspray of the vapor on the shield, wherein the shield is located entirely below the plane of conveyance.

20. A method for depositing a material on a substrate, comprising:

transporting the substrate into a deposition chamber enclosed by a housing;
conveying the substrate, in a transport direction, at a plane of conveyance, on a roll conveyor located within the deposition chamber; the roll conveyor comprising:
   a plurality of rollers having an elongated length perpendicular to the transport direction, wherein the plurality of rollers support and convey the substrate;
providing a vapor from a deposition source in the deposition chamber, wherein the deposition source is above the plane of conveyance;
directing the vapor toward a surface of the substrate having a temperature lower than the vapor, such that at least a portion of the vapor condenses on the substrate as a film; and
collecting an overspray of the vapor on a shield, wherein the shield is located entirely below the plane of conveyance, and wherein collecting an overspray of the vapor on the shield, further comprises: moving the shield in a continuous loop through the deposition chamber, wherein the shield is a collector ribbon or a shielding cable with a collecting surface, and wherein the continuous loop moves between adjacent ones of the plurality of rollers.

* * * * *